United States Patent [19]

Pickering et al.

[11] Patent Number: 5,584,936
[45] Date of Patent: Dec. 17, 1996

[54] SUSCEPTOR FOR SEMICONDUCTOR WAFER PROCESSING

[75] Inventors: Michael A. Pickering, Dracut; Lee E. Burns, Reading, both of Mass.

[73] Assignee: CVD, Incorporated, Woburn, Mass.

[21] Appl. No.: 572,479

[22] Filed: Dec. 14, 1995

[51] Int. Cl.$^6$ .................................................. C23C 16/00
[52] U.S. Cl. ........................................ 118/728; 118/500
[58] Field of Search ................................. 118/725, 728, 118/729, 730, 500

[56] References Cited

U.S. PATENT DOCUMENTS

| | | | |
|---|---|---|---|
| 3,436,255 | 4/1969 | Harris | 117/201 |
| 4,094,269 | 6/1978 | Malinovski | 118/49.1 |
| 5,042,423 | 8/1991 | Wilkinson | 118/500 |
| 5,169,453 | 12/1992 | Takagi | 118/728 |
| 5,169,684 | 12/1992 | Takagi | 427/248.1 |
| 5,444,217 | 8/1995 | Moore | 219/405 |
| 5,465,184 | 11/1995 | Pickering et al. | 360/97.01 |

FOREIGN PATENT DOCUMENTS

| | | | |
|---|---|---|---|
| 3942931A1 | 6/1990 | Germany | 118/728 |
| 1-283845 | 11/1989 | Japan | 118/730 |
| 2-166726 | 6/1990 | Japan | 118/728 |
| 3-201429 | 9/1991 | Japan | 118/728 |
| 4-162615 | 6/1992 | Japan | 118/728 |
| 6-132221 | 5/1994 | Japan | 118/728 |

Primary Examiner—Robert Kunemund
Assistant Examiner—Jeffrie R. Lund
Attorney, Agent, or Firm—Taylor J. Ross; Gerald K. White

[57] ABSTRACT

A susceptor for rapid thermal processing for epitaxial deposition upon semiconductor wafers. The susceptor includes an outer supporting ring upon which the wafer rests. This outer ring is preferably formed of a monolithic mass of silicon carbide, and most preferably high purity β-phase (face-centered cubic) silicon carbide. The wafer is supported upon a small wafer shoulder on the ring. To prevent deposition upon the rear or bottom face of the wafer, a blocker shoulder is also provided in the ring, below the wafer shoulder, and a blocker is placed upon this shoulder. The blocker is preferably formed of quartz, and simply rests upon the shoulder. In this manner the ring and blocker may expand at different rates upon the rapid temperature changes, and the blocker or ring may be replaced.

12 Claims, 1 Drawing Sheet

SUSCEPTOR FOR SEMICONDUCTOR WAFER PROCESSING

BACKGROUND OF THE INVENTION

1. Field of the Invention

The present invention relates in general to susceptors for semiconductor wafer processing. In particular, the present invention relates to an improved multipart susceptor for rapid thermal processing of semiconductor wafers.

2. Description of the Related Art

In the manufacture of semiconductor wafers, there are numerous process steps. One set of steps is referred to as epitaxial deposition, and generally consists of depositing a thin layer (between approximately 10 to less than one micron) of epitaxial silicon upon the wafer. This is achieved using specialized equipment and a chemical vapor deposition (CVD) process. The CVD process requires that the wafer be heated to very high temperatures, on the order of 1200° C. (2000° F.).

There has been a recent trend in this art to employ equipment which operates upon a single wafer, rather than a group of wafers. In this single wafer equipment the heating of the wafer to the CVD temperature is greatly accelerated, so that the wafer is typically taken from room temperature to the elevated temperature within approximately 30 seconds. This has been known as rapid thermal processing, or RTP. While the silicon wafer accepts this rapid temperature change well, the wafer must be held in position by a mechanical component known as a susceptor. To form a susceptor which will maintain its shape and still withstand the temperature change, the susceptors have been formed of graphite cores surrounded by a layer of silicon carbide.

While this has been acceptable for the rapid heating and CVD portion of the process, the deposition of the epitaxial silicon layer is not limited to the wafer. In other words, the silicon is also deposited upon the susceptor holding the wafer. To prevent excessive buildup of silicon, the susceptor is periodically cleaned by use of a hydrochloric acid vapor or similar etchants. This vapor removes the deposited silicon from the susceptor. However, it also removes small amounts of the silicon carbide layer, forming pin holes. This exposes the graphite core.

The manufacture of semiconductors requires very stringent standards for purity and cleanliness. While the silicon carbide coating on the susceptor is very inert and harmless to the process, graphite is not. As such, the formation of pinholes which expose the graphite core of the susceptor causes contamination of the wafer being produced. The number of pinholes increases with each cleaning of the susceptor, and as such so does the amount of contamination from the susceptor. At some point (typically about one to five thousand cycles) the amount of wafer contamination will be unacceptable and the susceptor must be replaced.

SUMMARY OF THE INVENTION

An object of the present invention is to provide a susceptor for epitaxial wafer processing of the RTP type.

Another object of the present invention is to provide such a susceptor which reliably tolerates the temperature changes of such a process.

A further object of the present invention is to provide such a susceptor which is inert and does not cause contamination of the wafer.

Yet another object of the present invention is to provide such a susceptor which may be cleaned without serious damage and exposure of contaminating materials.

A further object of the present invention is to provide such a susceptor which has an improved life of many thousands, and up to tens of thousands, of cycles.

These and other objects are achieved by a susceptor for rapid thermal processing for epitaxial deposition upon semiconductor wafers. The susceptor includes an outer supporting ring upon which the wafer rests. This outer ring is preferably formed of a monolithic mass of silicon carbide, and most preferably high purity β-phase (face-centered cubic) silicon carbide. The wafer is supported upon a small wafer shoulder on the ring. To prevent deposition upon the rear or bottom face of the wafer, a blocker shoulder is also provided in the ring, below the wafer shoulder, and a blocker is placed upon this shoulder. The blocker is preferably formed of quartz, and simply rests upon the shoulder. In this manner the ring and blocker may expand at different rates upon the rapid temperature changes, and the blocker or ring may be replaced.

BRIEF DESCRIPTION OF THE DRAWINGS

The objects and features of the invention noted above are explained in more detail with reference to the drawings, in which like reference numerals denote like elements, and in which.

DETAILED DESCRIPTION OF THE INVENTION

Figure 1:
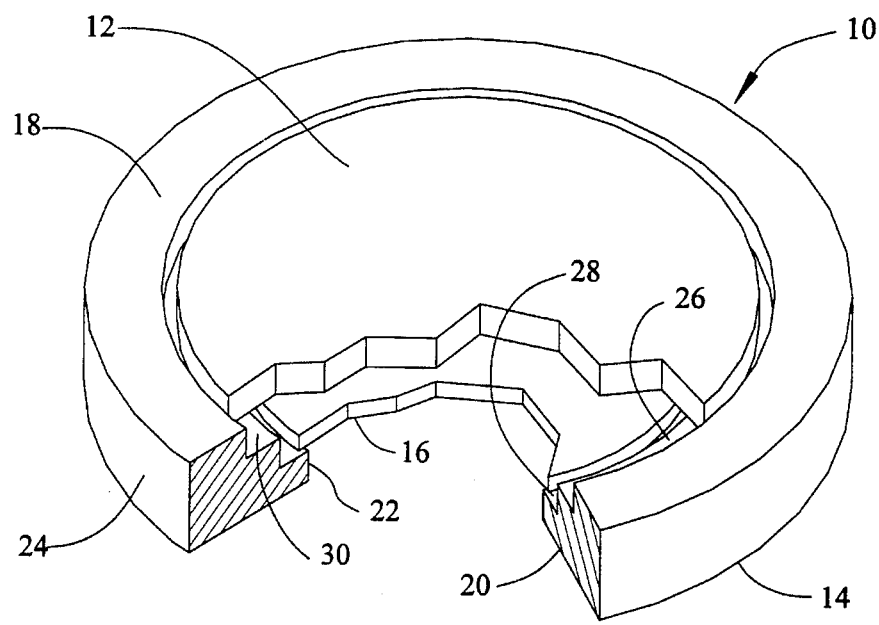
FIG. 1 is a perspective view with partial cut-away showing a susceptor according to the present invention supporting a wafer.

With reference to FIG. 1, a susceptor according to the present invention is generally designated by reference numeral 10. As shown, the susceptor 10 is used to support a semiconductor wafer 12 during various fabrication processes for the wafer, such as doping, etc. As is known, such wafers take the form of a relatively thin rigid disk.

The susceptor 10 is formed of two basic components, a ring 14 and a blocker 16. The ring 14 is a generally annular member having upper and lower faces 18 and 20, respectively, and inner and outer side walls 22 and 24, respectively. The ring also includes two shoulders formed at the inner side wall 22, designated as wafer shoulder 26 and blocker shoulder 28 (FIG. 1). Wafer shoulder 26 opens onto the upper face 18, while the blocker shoulder 28 opens onto the wafer shoulder.

Figure 2:
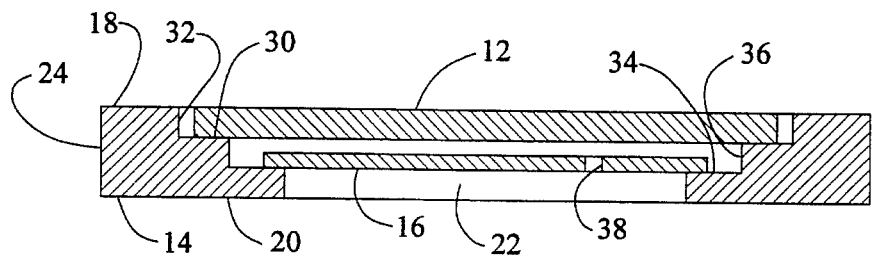
FIG. 2 is a cross-sectional side view of the susceptor and wafer of FIG. 1.

Specifically, the wafer shoulder includes a planar seat 30 extending normal to the longitudinal axis of the ring, and a tubular back wall 32 coaxial with the longitudinal axis. It is the back wall 32 which intersects the upper face 18. In a similar manner, the blocker shoulder includes a seat 34 and a back wall 36, with the back wall 36 of the blocker shoulder intersecting the seat 30 of the wafer shoulder. As is shown, the seats provide a support against gravity for the wafer and blocker, while the back walls provide support against movement of the wafer or blocker laterally. In each case the diameter of the back wall will be slightly greater than that of the wafer or blocker, respectively, to permit these items to be easily inserted in, and removed from, the ring. Further, the seats are spaced a distance greater than the thickness of the blocker, such that there is a space between the bottom face of the wafer and the top face of the blocker, as shown in FIG. 2.

It is noted that the shoulders have been exaggerated in the drawings. In the preferred form, the radial depth of the shoulders (i.e., the seats 30 and 34) is actually on the order of about 0.1– 0.65 cm (0.05–0.25 inches). This is sufficient to support the wafer or blocker. Additionally, this is sufficient to permit a difference in thermal expansion should the ring be formed of materials different from that of the wafer and/or blocker. Materials to form the ring and blocker will be discussed more fully below.

While the blocker has been shown as simply resting upon the shoulder 28, any other arrangement for securing the blocker in place on the ring may be employed. It is also possible to provide the blocker and/or ring with appropriate alignment elements for use with existing wafer processing equipment. For example, the ring may be provided with appropriate recesses (not shown) for engagement with susceptor lifting fingers. In a similar manner, the blocker may be provided with a plurality of through holes 38 (FIG. 2) to permit passage of wafer lifting fingers, known in the art to be used to remove the wafer from the susceptor.

If the blocker is provided with the holes 38, it is typically necessary to ensure that the holes are in the proper position to receive the fingers, and as such it necessary to provide the blocker with an arrangement to ensure the proper orientation of the blocker with respect to the ring. Various arrangements are of course possible. A preferred arrangement is shown in FIGS. 3 and 4.

Figure 3:
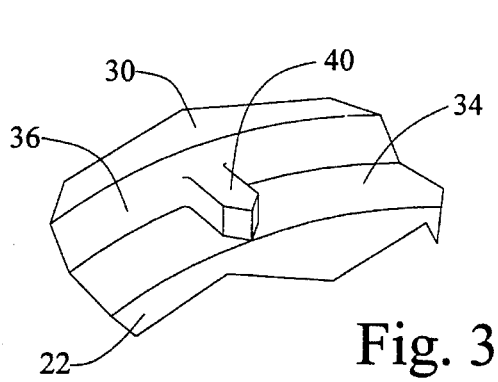
FIGS. 3 and 4 are detail perspective views showing mating studs and protrusions between the susceptor ring and blocker.
Figure 4:
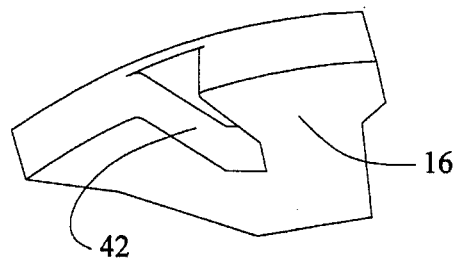

With reference to FIG. 3, the ring 14 is provided with a plurality (preferably three) of angularly spaced alignment studs 40. The studs 40 are located on the seat 34 of the blocker shoulder 28. In particular, the studs 40 extend outward from the back wall 36 along the seat 34, and are spaced from the seat 30 of the wafer shoulder. The studs may be formed during the machining operation to form the blocker shoulder. The blocker 16 is provided with a plurality of mating alignment recesses 42, each sized, shaped, and placed to receive an associated one of the studs 40. This results in the recesses 42 extending inward from the periphery of the blocker, as shown in FIG. 4. As may be envisioned, locating the blocker on the shoulder with the studs received in the recesses will result in the blocker being supported upon the shoulder vertically, and against rotation about the longitudinal axis with respect to the ring.

It is noted that such an alignment arrangement is only required for use with equipment having wafer lifting fingers which extend through the holes 38. Other known wafer processing equipment employ vacuum-type wafer lifters, and for this type of equipment the blocker need not be provided with either the holes or the alignment arrangement.

The above description completes the exterior or structural description of the invention. To complete the description, the various materials which may be used to form the ring and blocker will next be described.

In general, the ring and blocker may be formed of the same or different materials. For either element the only constraint is that the material withstand the process temperatures while remaining sufficiently rigid and flat, and without unduly contaminating the wafer. Various common materials may of course be employed. For example the ring and/or blocker may be formed of quartz, silicon, graphite coated with silicon carbide, or common (i.e., α phase) silicon carbide. In the preferred form, the blocker is formed of quartz.

The use of quartz for the blocker is advantageous for several reasons. First, quartz is a relatively inexpensive material, and forming a blocker of quartz would be quite economical. Quartz also provides excellent thermal resistance and thermal expansion properties, as well as remaining rigid at the elevated temperatures. A further advantage is that quartz is transparent, or nearly transparent, to much thermal radiation. As such, the thermal radiation portion of the heating will pass through the quartz and serve to heat the wafer. Since it is the wafer that is desired to be heated for the epitaxial deposition, this may reduce the time required to heat the wafer for deposition. This could of course lead to a reduction in cycle time, and increased wafer production.

While the blocker is advantageously formed of quartz, the ring is preferably formed of a monolithic mass of high purity β-phase silicon carbide.

Such monolithic masses are available from the assignee of the present invention, and consist of extremely pure β (face-centered cubic) silicon carbide formed in a chemical vapor deposition process described in U.S. Pat. No. 5,465,184 to Pickering et al., which is included herein by reference. This preferred material is 99.999% pure silicon carbide, is void free, stoichiometric (equal number of Si and C atoms), and has large grain size. This results in a ring (and possibly blocker) which is strong at room and elevated temperatures, may be machined to precise dimensions, retains its shape (and in particular flatness) after repeated heating and cooling cycles, has excellent thermal conductivity, and is inert so as to be durable in the deposition atmosphere and acid vapor cleaning while causing no wafer contamination. For these reasons the monolithic mass of β-phase silicon carbide is preferred for the ring.

While any of the noted materials may be used to form the susceptor of the present invention, the use of a monolithic mass of β silicon carbide is believed to necessitate the present invention, at least for economically feasible use. Specifically, while the silicon carbide is a preferred material for the reasons noted above, the most common prior art susceptor design will not perform effectively when formed of this silicon carbide.

For example, it is known in the prior art to form a susceptor similar to a flat plate having a low rim at the edge to prevent lateral movement of the wafer. This is similar to extending the wafer shoulder seat 30 of this invention across the central portion of the ring to form an uninterrupted plane upon which the wafer rests. This design operates well when formed of a graphite core coated with standard silicon carbide. When β-phase silicon carbide is used to form such a susceptor, however, performance is limited, while cost is increased. Specifically, performance is acceptable when such a β silicon carbide susceptor is rapidly heated together with a wafer. However, when such a susceptor is heated alone (as occurs during the acid etch/cleaning), the susceptor may crack after an unacceptably low number of cycles, unless the thermal gradient is controlled.

While the exact reason for this cracking is not known, it is believed to be due to stresses created by the difference in thermal mass between the thinner central region for supporting the wafer and the thicker outer rim. Given the increased cost of forming a monolithic mass of the β silicon carbide, the low number of cycles before such cracking occurs makes this material unsuitable for use in prior art designs. However, by forming the susceptor as a ring having a separate blocker in the present invention, the cracking problem is avoided. While the shoulders 26 and 28 do result in a difference in thickness, the small radial depth of the shoulders does not create sufficient stresses to damage the ring.

Further, the blocker is separate from the ring, and thus may expand with respect to the ring so that no stresses are transferred. In practice, the epitaxial deposition may result in a thin layer of silicon being deposited over the junction of the blocker and the ring, securing these two components together. However, the thin nature of any such coating is believed to ensure that the coating will break before dangerous stresses are transferred between the ring and blocker.

As such, the susceptor of the present invention may provide advantages in weight, cost, and productivity when employed with prior art materials. Additionally, the susceptor of the present invention permits the use of the improved β phase silicon carbide, which was not possible in prior art susceptors.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A susceptor for supporting a single semiconductor wafer during deposition, comprising:

an annular ring having an upper face, a lower face, and inner and outer side walls, said inner side wall including a wafer shoulder constructed and arranged to receive the wafer thereon; and a blocker mounted upon said ring at a position below said wafer shoulder, said blocker being mounted with a radial gap between said ring and said blocker to relative movement in the radial direction with respect to said ring to permit differences in thermal expansion.

2. A susceptor as in claim 1, wherein said ring is formed of a monolithic mass of high-purity β-phase silicon carbide.

3. A susceptor as in claim 2, wherein said blocker is formed of quartz.

4. A susceptor as in claim 1, wherein said inner side wall of said ring further includes a blocker shoulder, and said blocker rests upon said blocker shoulder.

5. A susceptor as in claim 4, wherein said ring is formed of a monolithic mass of high-purity β-phase silicon carbide.

6. A susceptor as in claim 5, wherein said blocker is formed of quartz.

7. A susceptor as in claim 4, wherein said wafer shoulder includes a seat and a back wall, with said back wall intersecting said upper face of said ring, and said blocker shoulder includes a seat and a back wall, with said back wall of said blocker shoulder intersecting said seat of said wafer shoulder.

8. A susceptor as in claim 7, wherein said ring is formed of a monolithic mass of high-purity β-phase silicon carbide.

9. A susceptor as in claim 8, wherein said blocker is formed of quartz.

10. A susceptor as in claim 7, wherein said blocker shoulder includes at least one stud, and said blocker includes at least one mating recess receiving said stud.

11. A susceptor as in claim 10, wherein said ring is formed of a monolithic mass of high-purity β-phase silicon carbide.

12. A susceptor as in claim 11, wherein said blocker is formed of quartz.

* * * * *